(12) United States Patent
Shin

(10) Patent No.: US 12,393,234 B2
(45) Date of Patent: Aug. 19, 2025

(54) DISPLAY MODULE

(71) Applicant: Samsung Display Co., LTD., Yongin-si (KR)

(72) Inventor: Jaiku Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 208 days.

(21) Appl. No.: 18/365,092

(22) Filed: Aug. 3, 2023

(65) Prior Publication Data

US 2024/0134420 A1    Apr. 25, 2024
US 2024/0231439 A9    Jul. 11, 2024

(30) Foreign Application Priority Data

Oct. 24, 2022    (KR) ........................ 10-2022-0137508

(51) Int. Cl.
     *G06F 1/16*      (2006.01)
     *H04M 1/02*      (2006.01)

(52) U.S. Cl.
     CPC .......... *G06F 1/1656* (2013.01); *G06F 1/1616* (2013.01); *H04M 1/0216* (2013.01)

(58) Field of Classification Search
     CPC .... G06F 1/1652; G06F 1/1616; G06F 1/1641; G06F 1/1681; G06F 1/1637; G06F 1/1626; G06F 1/1656; G06F 1/18; G06F 1/203; H05K 1/0277; H05K 1/0281; H05K 5/0017; H05K 5/0226; H05K 5/03;
(Continued)

(56) References Cited

U.S. PATENT DOCUMENTS 10,488,887 B2 * 11/2019 Yamazaki ............... F21V 15/04
11,570,910 B2 * 1/2023 Kim ..................... H10K 50/844
(Continued)

FOREIGN PATENT DOCUMENTS

EP           3958339 A1    2/2022
KR     10-2392671 B1    11/2016
(Continued)

OTHER PUBLICATIONS

International Search Report and Written Opinion of the International Searching Authority, mailed/dated Jan. 23, 2024, corresponding to PCT/KR2023/016453, 3 pages.

*Primary Examiner* — Abhishek M Rathod
(74) *Attorney, Agent, or Firm* — Womble Bond Dickinson (US) LLP

(57) ABSTRACT

A display module includes: a display portion having a first area, a second area spaced apart from the first area, and a folding area between the first area and the second area; a first support portion under the display portion and supporting the display portion in the first area, the second area, and the folding area; a second support portion under the first support portion, the second support portion including a first sub-support portion supporting the first area of the display portion and a second sub-support portion supporting the second area of the display portion and spaced apart from the first sub-support portion; and an elastic portion between the first sub-support portion and the second sub-support portion. When the display portion is unfolded to support the folding area of the display portion, the elastic portion is compressed by each of the first sub-support portion and the second sub-support portion.

17 Claims, 13 Drawing Sheets

(58) Field of Classification Search
CPC .......... H10K 50/8426; H10K 2102/311; B32B 17/06; B32B 17/10; B32B 9/04; B32B 2307/412; B32B 2307/732
See application file for complete search history.

(56) References Cited

U.S. PATENT DOCUMENTS

| | | |
|---|---|---|
| 2016/0338219 A1 | 11/2016 | Seo et al. |
| 2017/0062742 A1* | 3/2017 | Kim ..................... H10K 50/844 |
| 2020/0229312 A1* | 7/2020 | Ha ....................... H10K 77/111 |
| 2020/0341508 A1 | 10/2020 | Hwang et al. |
| 2021/0141124 A1* | 5/2021 | Park ........................ G09F 9/301 |
| 2021/0191459 A1* | 6/2021 | Kim ..................... H10K 59/87 |
| 2021/0287576 A1* | 9/2021 | Park ........................ B32B 17/06 |
| 2022/0151083 A1* | 5/2022 | Park .................... H05K 7/2039 |
| 2022/0174823 A1 | 6/2022 | Kim et al. |
| 2022/0374058 A1* | 11/2022 | Kim ..................... G06F 1/1686 |
| 2023/0035622 A1 | 2/2023 | Kang et al. |

FOREIGN PATENT DOCUMENTS

| | | |
|---|---|---|
| KR | 10-2019-0050325 A | 5/2019 |
| KR | 10-2020-0126480 A | 11/2020 |
| KR | 10-2021-0085145 A | 7/2021 |
| KR | 10-2021-0089810 A | 7/2021 |
| KR | 10-2022-0032780 A | 3/2022 |
| KR | 10-2022-0063834 A | 5/2022 |
| KR | 10-2022-0077953 A | 6/2022 |

* cited by examiner

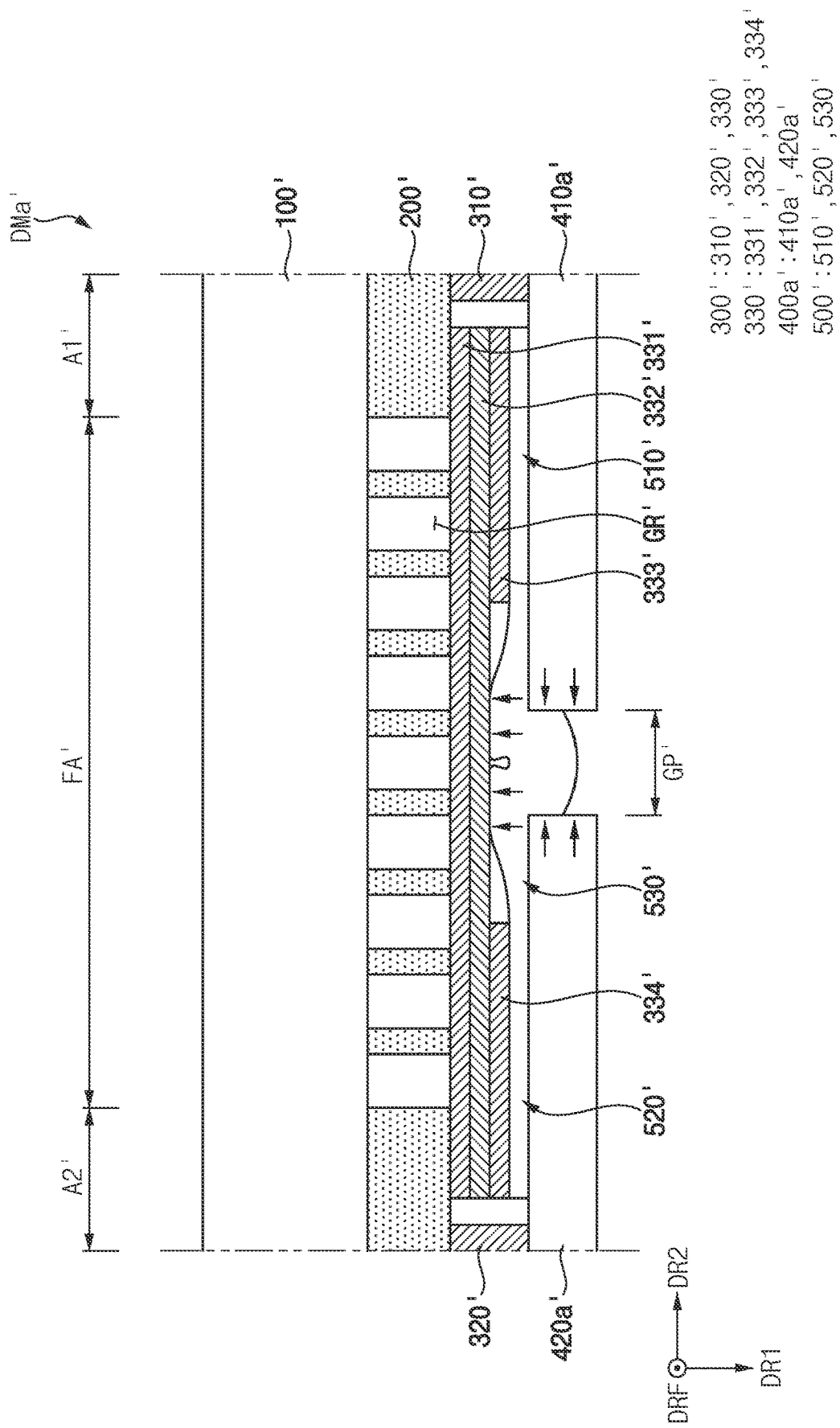

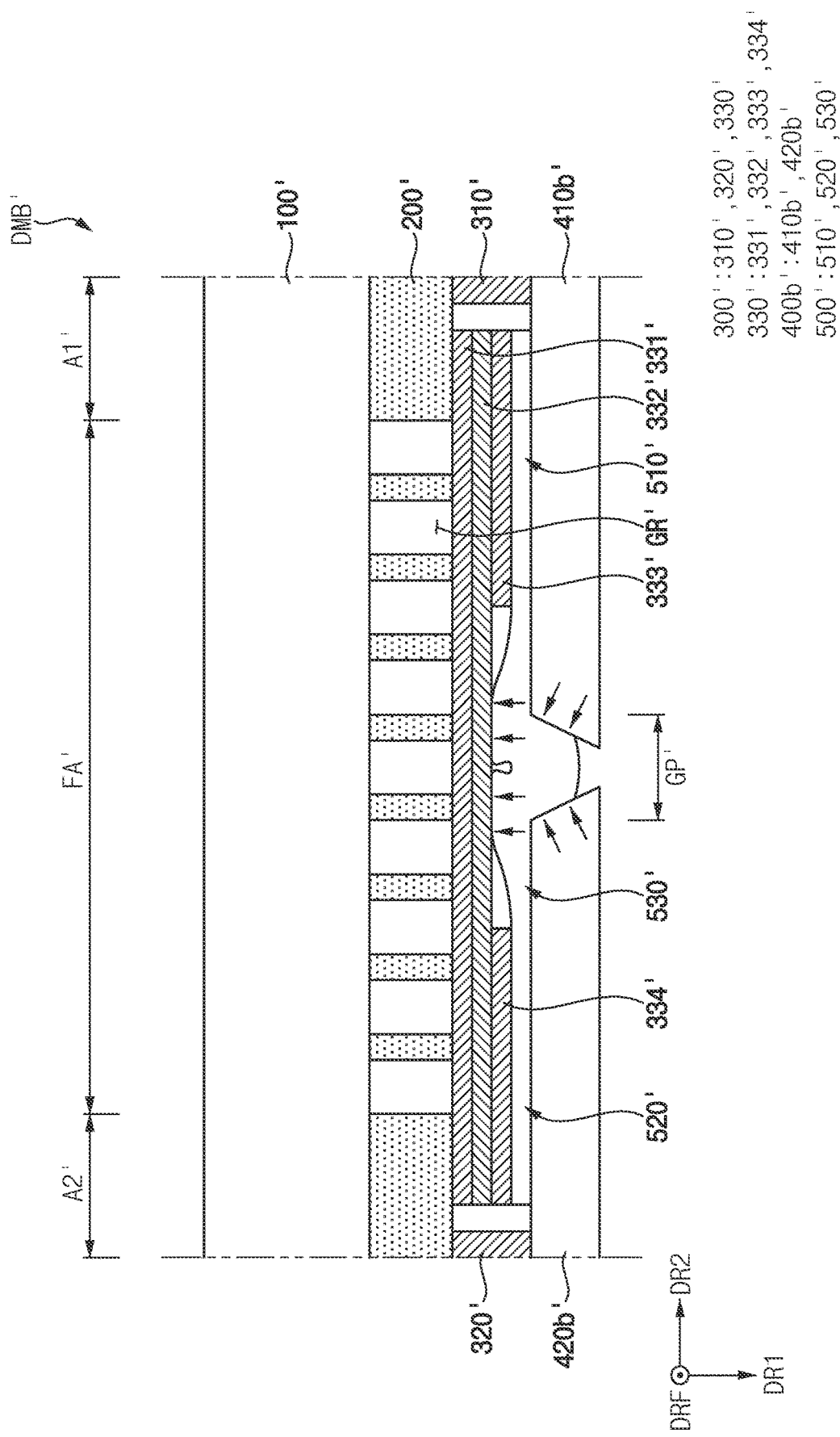

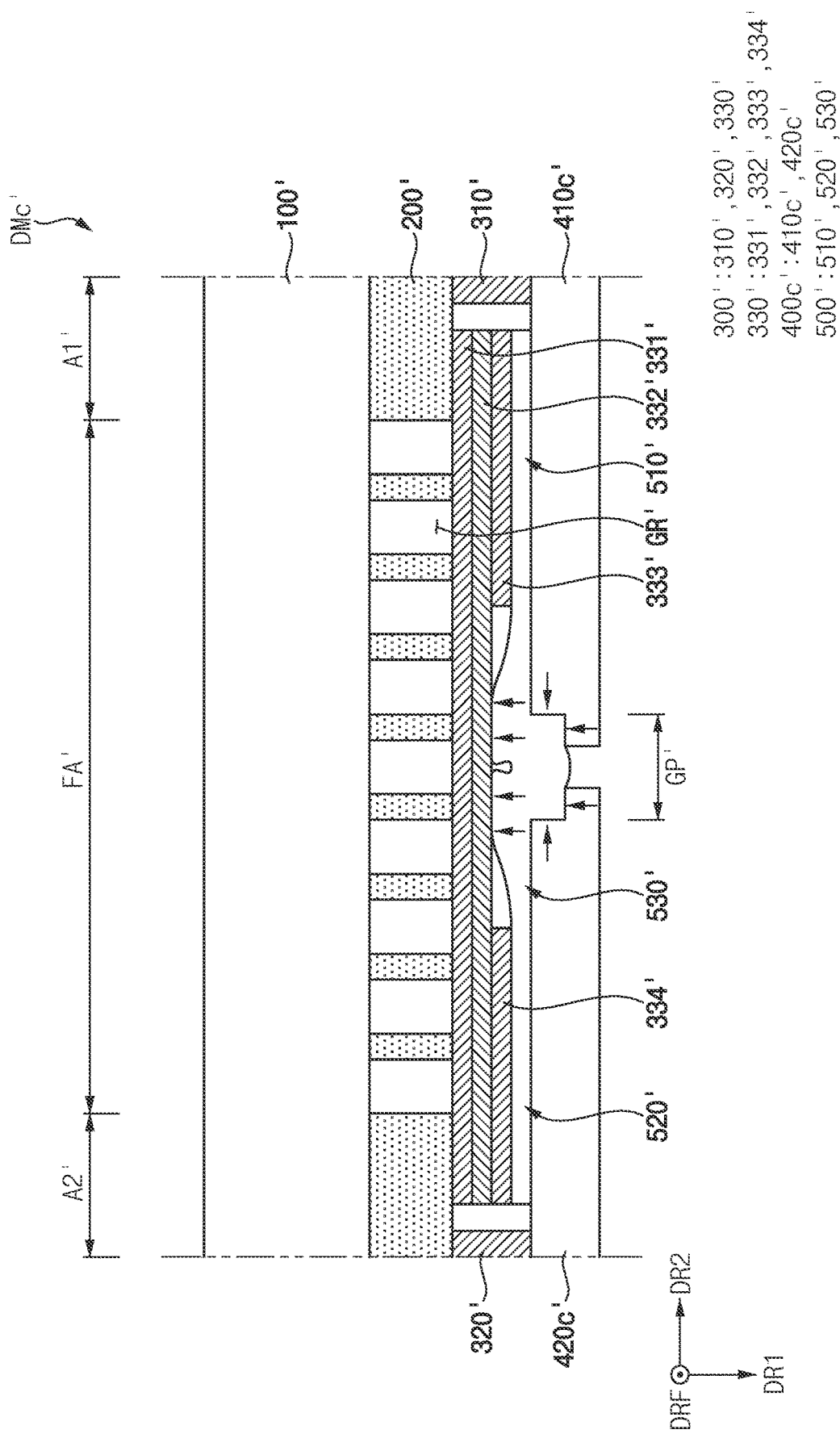

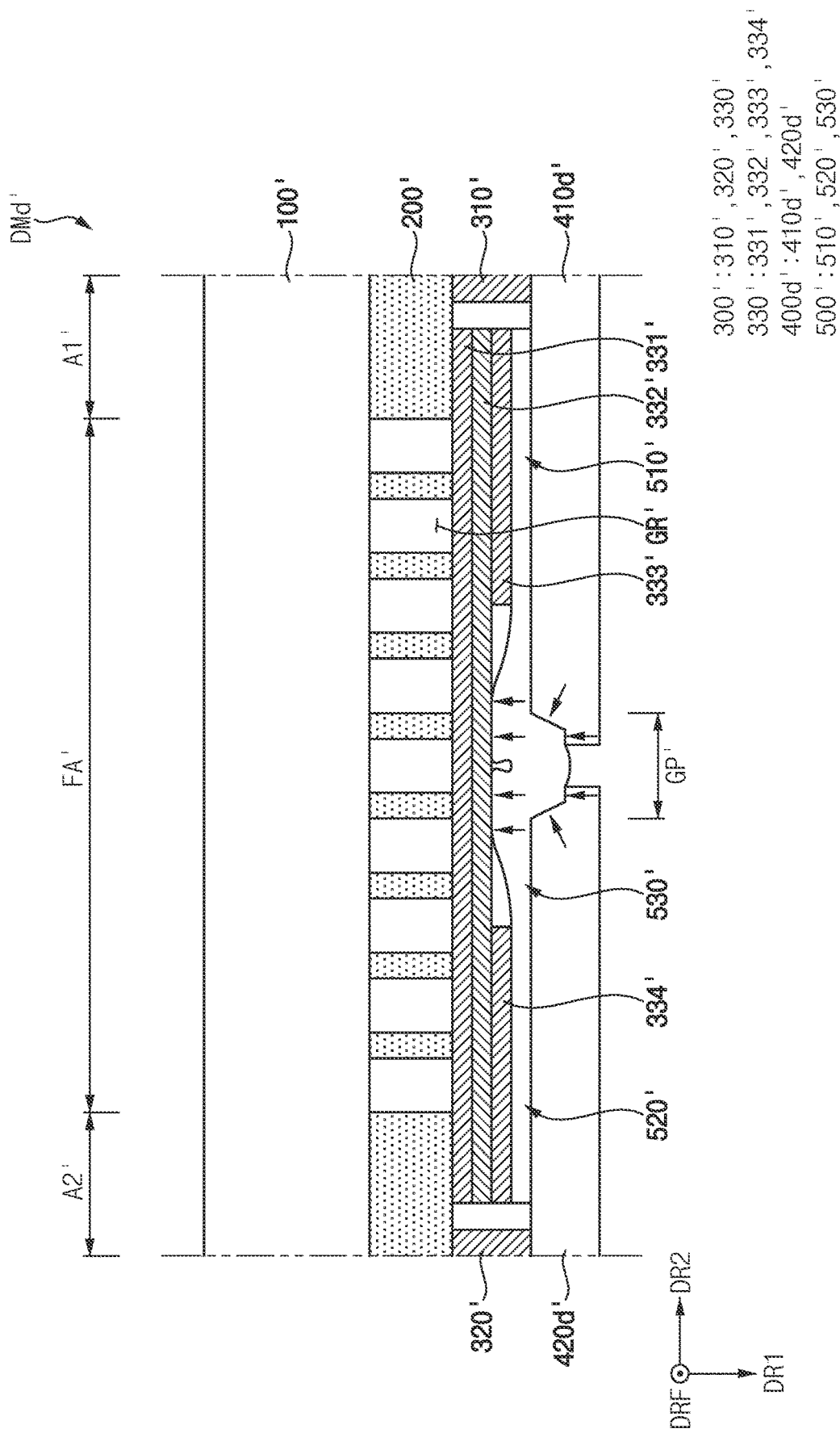

DISPLAY MODULE

CROSS-REFERENCE TO RELATED APPLICATION

This application claims priority to and the benefit of Korean Patent Application No. 10-2022-0137508, filed on Oct. 24, 2022, in the Korean Intellectual Property Office (KIPO), the entire disclosure of which is incorporated herein by reference.

BACKGROUND

1. Field

Aspects of embodiments of the present disclosure relate to a display module.

2. Description of the Related Art

A foldable display device is a display device that is designed to be repeatedly folded or unfolded. The foldable display device may include a display module having a flexible area (e.g., having flexibility in a partial area or a folding area) at where the display module can be repeatedly folded or unfolded, and a housing (or a case) for accommodating the display module.

However, the display module may be relatively vulnerable to an external impact in the folding area. For example, when a user of a display device who uses the foldable display device applies pressure, such as a touch input, to the folding area when the display module is unfolded, the folding area of the display module may be damaged (e.g., by pressing, etc.). Accordingly, a display defect may occur in the folding area of the display module.

SUMMARY

An embodiment of the present disclosure provides a display module preventing a display defect in a folding area.

However, aspects and features of the present disclosure are not limited to the above aspect and feature and may be expanded in various ways without departing from the spirit and scope of the present disclosure.

A display module, according to one embodiment of the present disclosure, includes: a display portion having a first area, a second area spaced apart from the first area, and a folding area between the first area and the second area; a first support portion under the display portion and supporting the display portion in the first area, the second area, and the folding area; a second support portion under the first support portion, the second support portion including a first sub-support portion supporting the first area of the display portion and a second sub-support portion supporting the second area of the display portion and spaced apart from the first sub-support portion; and an elastic portion between the first sub-support portion and the second sub-support portion. When the display portion is unfolded to support the folding area of the display portion, the elastic portion is compressed by each of the first sub-support portion and the second sub-support portion.

Each of the first sub-support portion and the second sub-support portion may be spaced apart from the elastic portion when the display portion is folded.

The display module may further include: a first adhesive portion between the first sub-support portion and the first support portion and bonding the first sub-support portion and the first support portion to each other; a second adhesive portion between the second sub-support portion and the first support portion and bonding the second sub-support portion and the first support portion to each other; and a third adhesive portion between the first adhesive portion and the second adhesive portion and bonding the first support portion and the elastic portion to each other.

The third adhesive portion may include: a first adhesive layer under the first support portion, the first adhesive layer may include an adhesive member entirely overlapping the folding area and a barrier layer under the adhesive member and entirely overlapping the folding area; and a second adhesive layer under the barrier layer and bonding the barrier layer and the elastic portion to each other.

The first support portion may have a plurality of grooves therein, and the grooves may be at an area of the first support portion overlapping the folding area and may extend in a thickness direction of the display portion.

The first sub-support portion may include a first protruding portion protruding toward the second sub-support portion when the display portion is unfolded to press a lower surface of the elastic portion, and the second sub-support portion may include a second protruding portion protruding toward the first sub-support portion when the display portion is unfolded to press the lower surface of the elastic portion.

When the display portion is unfolded, a spacing distance between the first sub-support portion and the second sub-support portion may gradually decrease in a direction away from a lower surface of the display portion when viewed in a cross-sectional view.

The first sub-support portion may entirely overlap the first area of the display portion when the display portion is unfolded, and the second sub-support portion may entirely overlap the second area of the display portion when the display portion is unfolded.

A density of the elastic portion when the display portion is unfolded may be greater than the density of the elastic portion when the display portion is folded.

A volume of the elastic portion when the display portion is unfolded may be equal to or less than 80% of the volume of the elastic portion in when the display portion is folded.

A display module, according to another embodiment of the present disclosure, includes: a display portion having a first area, a second area spaced apart from the first area, and a folding area between the first area and the second area; a first support portion under the display portion and supporting the display portion in the first area, the second area, and the folding area; a second support portion under the first support portion, the second support portion including a first sub-support portion supporting the first area of the display portion and a second sub-support portion supporting the second area of the display portion and spaced apart from the first sub-support portion; and an elastic portion including: a first fixing portion bonded to the first support portion between the first sub-support portion and the first support portion; a second fixing portion bonded to the first support portion between the second sub-support portion and the first support portion; and a non-fixing portion extending between the first fixing portion and the second fixing portion and supporting the folding area of the display portion when the non-fixing portion is compressed by each of the first sub-support portion and the second sub-support portion when the display portion is unfolded.

The first support portion may have a plurality of grooves therein at an area overlapping the folding area and extending in a thickness direction of the display portion.

The first sub-support portion may include a first protruding portion protruding toward the second sub-support portion when the display portion is unfolded to press a lower surface of the elastic portion, and the second sub-support portion may include a second protruding portion protruding toward the first sub-support portion when the display portion is unfolded to press the lower surface of the elastic portion.

When the display portion is unfolded, a spacing distance between the first sub-support portion and the second sub-support portion may gradually decrease in a direction away from a lower surface of the display portion when viewed in a cross-sectional view.

The first sub-support portion may entirely overlap the first area of the display portion when the display portion is unfolded, and the second sub-support portion may entirely overlap the second area of the display portion when the display portion is unfolded.

A density of the non-fixing portion when the display portion is unfolded may be greater than the density of the non-fixing portion when the display portion is folded.

A volume of the non-fixing portion when the display portion is unfolded may be equal to or less than 80% of the volume of the non-fixing portion when the display portion is folded.

The first fixing portion may directly contact an upper surface of the first sub-support portion, and the second fixing portion may directly contact an upper surface of the second sub-support portion.

Each of the first sub-support portion and the second sub-support portion may be spaced apart from the non-fixing portion when the display portion is folded.

The display module may further include: a first adhesive layer under the first support portion and entirely overlapping the folding area; a barrier layer under the first adhesive layer and entirely overlapping the folding area; and a second adhesive layer under the barrier layer and including: a first sub-adhesive layer bonding the barrier layer and the first fixing portion to each other; and a second sub-adhesive layer bonding the barrier layer and the second fixing portion to each other and spaced apart from the first sub-adhesive layer.

According to one embodiment of the present disclosure, a display module may include an elastic portion supporting a folding area of a display portion when the elastic portion is compressed by each of a first sub-support portion and a second sub-support portion when the display portion is unfolded. Because the folding area of the display portion is supported by the elastic portion, a defect (e.g., a pressing, etc.) due to an external impact in the folding area of the display portion may be prevented.

According to another embodiment of the present disclosure, a display module may include an elastic portion including a non-fixing portion supporting a folding area of a display portion when the non-fixing portion is compressed by each of a first sub-support portion and a second sub-support portion when a display portion is unfolded. Because the folding area of the display portion is supported by the non-fixing portion of the elastic portion, a defect (e.g., a pressing, etc.) due to an external impact in the folding area of the display portion may be prevented.

However, aspects and features of the present disclosure are not limited to those described above and may be expanded in various ways without departing from the spirit and scope of the present disclosure.

BRIEF DESCRIPTION OF THE DRAWINGS

FIGS. 10 to 13 are enlarged cross-sectional views of the area B in FIG. 8 according to various embodiments.

DETAILED DESCRIPTION

Figure 1:
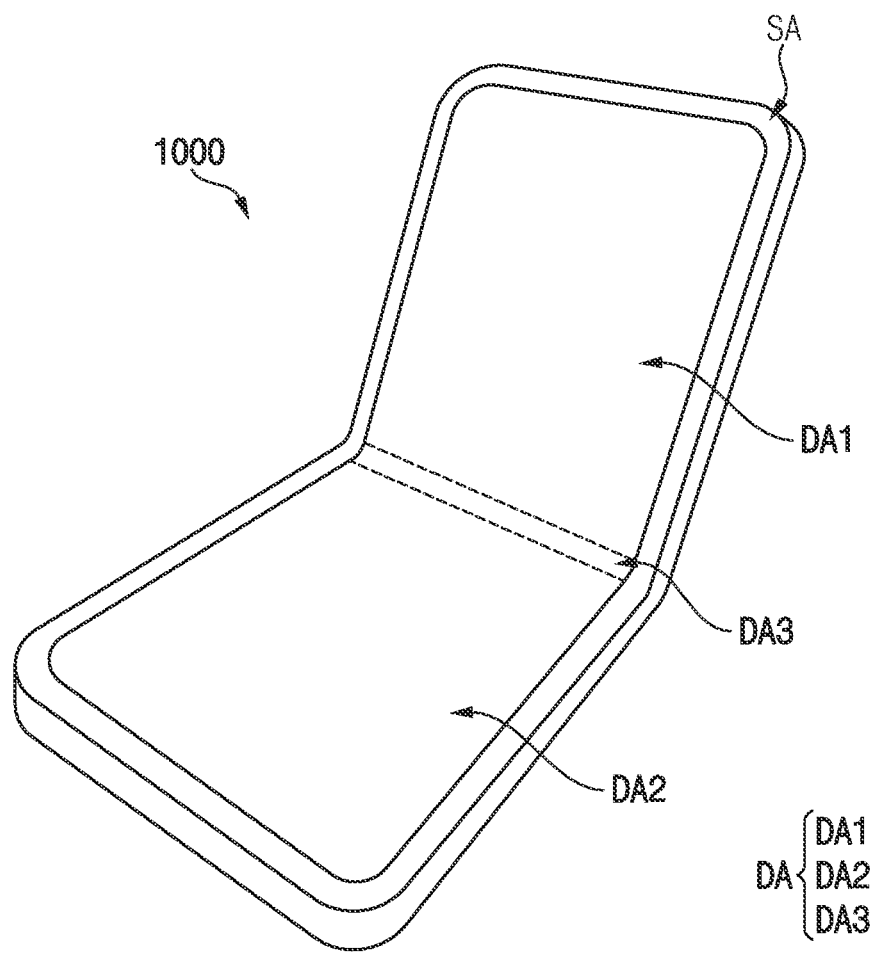
FIG. 1 is a perspective view of a display device according to an embodiment of the present disclosure.

Hereinafter, a display module according to embodiments of the present disclosure will be described in more detail with reference to the accompanying drawings.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

FIG. 1 is a perspective view of a display device according to an embodiment of the present disclosure.

Referring to FIG. 1, a display device 1000 may have a display area DA and a peripheral area SA.

The display area DA may be an area at where an image is displayed. The display device 1000 may include a plurality of pixels arranged in the display area DA, and each of the plurality of pixels may emit light. The display device 1000 may display an image by combining light emitted (e.g., by the combined light emitted) from the plurality of pixels.

The peripheral area SA may be adjacent to at least one side of the display area DA. For example, as illustrated in FIG. 1, the peripheral area SA may surround (e.g., may surround in a plan view or may extend around a periphery of) the display area DA. The display device 1000 may include a driving circuit disposed in the peripheral area SA, and the driving circuit may provide a driving signal to the plurality of pixels.

In one embodiment, the display area DA may include (or may be divided into) a first display area DA1, a second display area DA2, and a third display area DA3. Each of the first display area DA1, the second display area DA2, and the third display area DA3 may be an area at where an image is displayed.

The first display area DA1 and the second display area DA2 may be spaced apart from each other. The display device 1000 may have a substantially flat surface in the first display area DA1 and the second display area DA2 (e.g., the first and second display areas DA1 and DA2 may be substantially flat).

The third display area DA3 may be located between the first display area DA1 and the second display area DA2. In such an embodiment, the display device 1000 may be repeatedly folded or unfolded at the third display area DA3. For example, when the display device 1000 is folded, the first display area DA1 and the second display area DA2 may face each other, and the third display area DA3 may be bent to have a curvature (e.g., a predetermined curvature). In addition, when the display device 1000 is unfolded, the display device 1000 may have a substantially flat surface in each of the first display area DA1, the second display area DA2, and the third display area DA3 (e.g., when the display device 1000 is unfolded, the third display area DA3 may be substantially flat and substantially coplanar with the first and second display areas DA1 and DA2).

Figure 2:
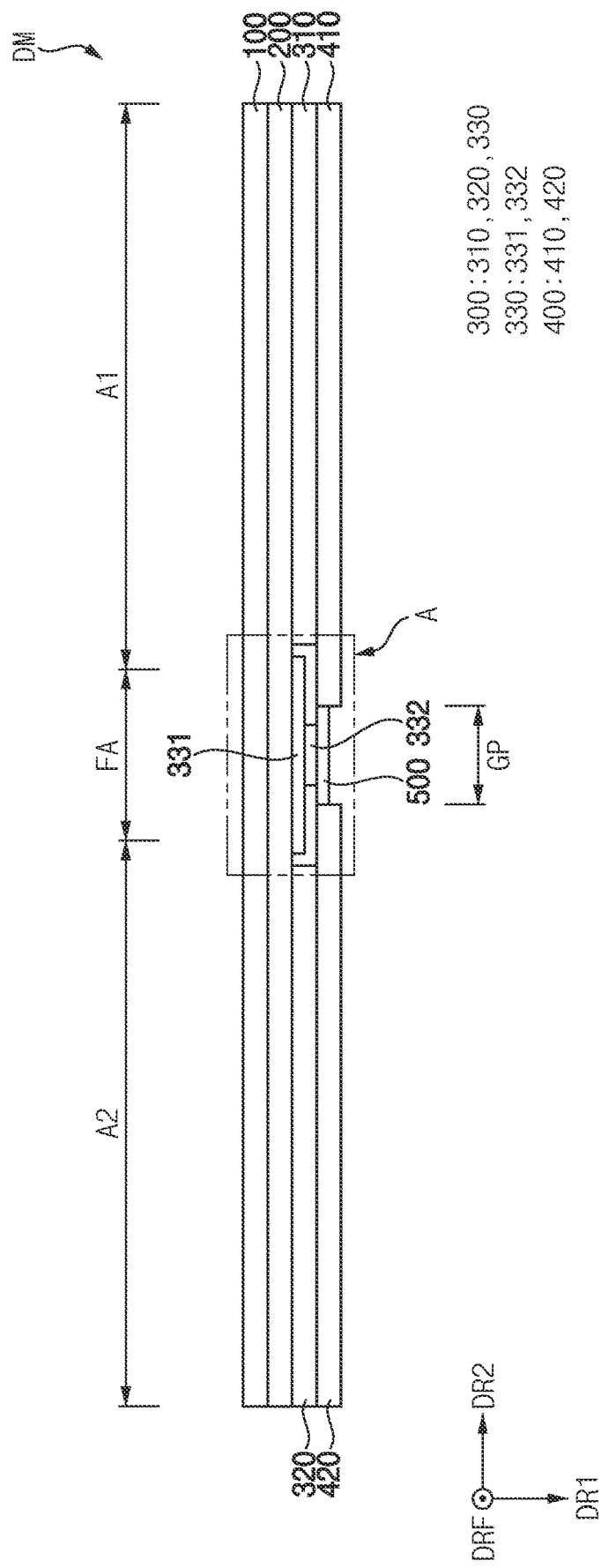
FIGS. 2 and 3 are cross-sectional views of a display module of the display device shown in FIG. 1.
Figure 3:
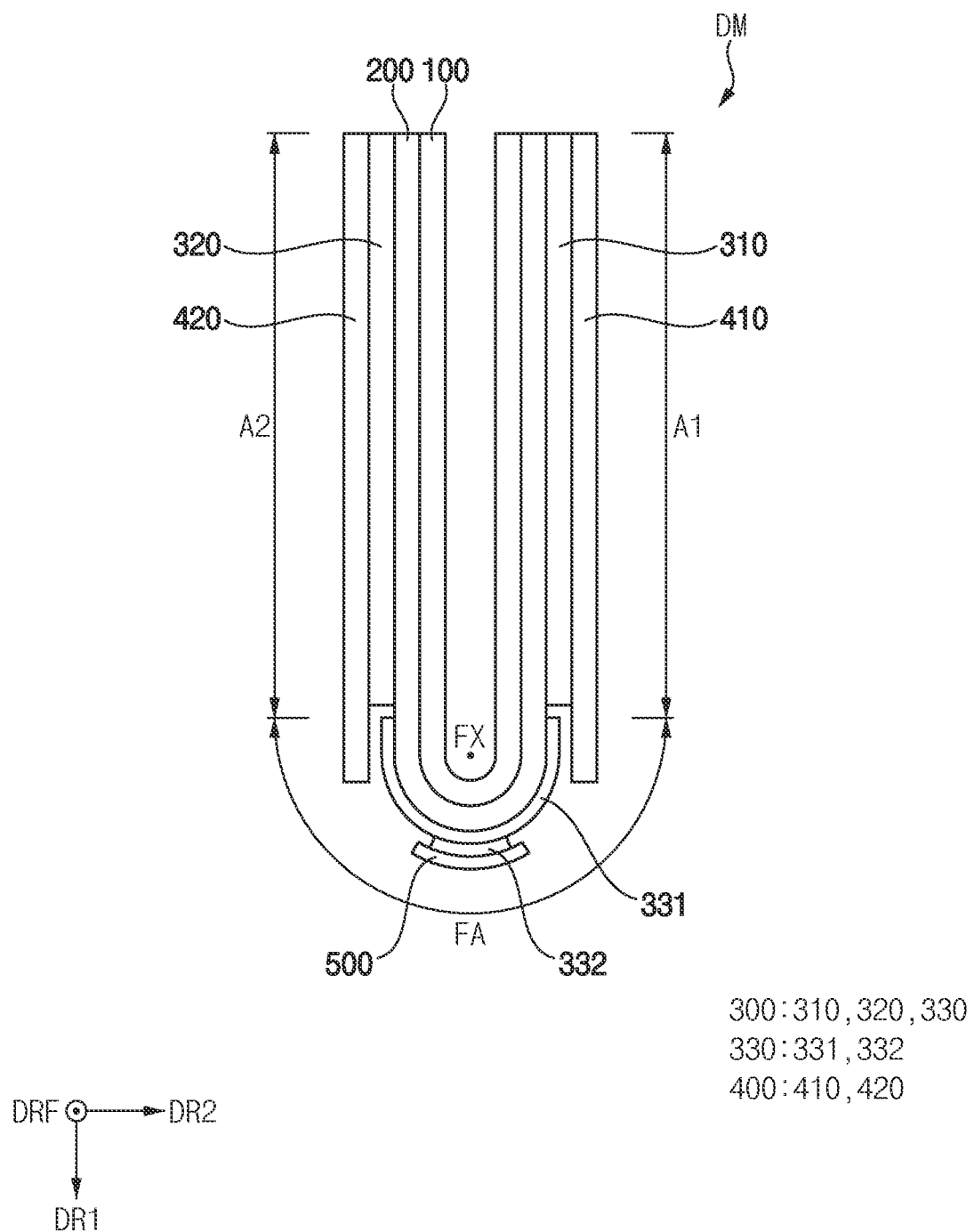

FIGS. 2 and 3 are views for explaining a display module included in the display device of FIG. 1. FIG. 2 is a sectional view illustrating a state in which the display module is unfolded, and FIG. 3 is a sectional view illustrating a state in which the display module is folded.

Referring to FIGS. 2 and 3, the display device 1000 may include a display module DM. The display module DM may be accommodated in a housing including a case for accommodating the display module DM, a hinge member (e.g., a hinge) for guiding repeated folding and unfolding of the display module DM, etc. In such an embodiment, the housing and the display module DM may constitute the display device 1000 shown in FIG. 1.

The display module DM may include a display portion 100, a first support portion 200, an adhesive portion 300, a second support portion 400, and an elastic portion 500.

The display portion 100 may include the display panel including the plurality of pixels. Accordingly, an image may be displayed on the display portion 100. In one embodiment, the display portion 100 may further include various functional layers disposed on (or under) the display panel. For example, the display portion 100 may further include a polarizing layer, a touch sensing layer, a cover glass, etc., which are disposed on the display panel. In some embodiments, the display portion 100 may further include a protective film disposed under the display panel.

The display portion 100 may include (or may be divided into) a first area A1, a second area A2 spaced apart from the first area A1, and a folding area FA disposed between the first area A1 and the second area A2. The plurality of pixels may be disposed in each of the first area A1, the second area A2, and the folding area FA, and accordingly, an image may be displayed in each of the first area A1, the second area A2, and the folding area FA.

The first area A1 may correspond to the first display area DA1 of the display device 1000, the second area A2 may correspond to the second display area DA2 of the display device 1000, and the folding area FA may correspond to the third display area DA3 of the display device 1000. For example, the display portion 100 may have a substantially flat surface in each of the first area A1 and the second area A2 and may be repeatedly folded or unfolded at the folding area FA about on a virtual folding axis FX extending in a folding direction DRF.

The first support portion 200 may be disposed under the display portion 100. The first support portion 200 may entirely support the display portion 100. In other words, the first support portion 200 may support the display portion 100 in the first area A1, the second area A2, and the folding area FA. To effectively support the display portion 100, the first support portion 200 may include a material having relatively high rigidity. For example, the first support portion 200 may include a metal material.

When the display portion 100 is repeatedly folded or unfolded at the folding area FA, the first support portion 200 overlapping the folding area FA may also be repeatedly folded or unfolded. In such an embodiment, and to improve flexibility of the first support portion 200 overlapping the folding area FA, rigidity of the first support portion 200 overlapping the folding area FA may be lower than rigidity of the first support portion 200 overlapping the first area A1 and the second area A2. For example, the first support portion 200 may have a plurality of grooves (e.g., GR in FIG. 4) overlapping the folding area FA and formed in a first direction DR1, that is, a thickness direction of the display portion 100 and is perpendicular to the folding direction DRF.

The adhesive portion 300 may be disposed under the first support portion 200. The adhesion portion 300 may include an adhesive material. For example, the adhesive portion 300 may include an adhesive, such as a pressure sensitive adhesive (PSA). The adhesive portion 300 may adhere to components disposed under the first support portion 200 (e.g., the second support portion 400 and the elastic portion 500), and accordingly, the components disposed under the first support portion 200 may be attached under the first support portion 200.

The adhesive portion 300 may include a first adhesive portion 310, a second adhesive portion 320, a third adhesive portion 330.

The first adhesive portion 310 may overlap at least a part of the first area A1. The second adhesive portion 320 may overlap at least a part of the second area A2, and the second adhesive portion 320 and the first adhesive portion 310 may be spaced apart from each other. In such an embodiment, each of the first adhesive portion 310 and the second adhesive portion 320 may not overlap (e.g., may be offset from) the folding area FA.

The third adhesive portion 330 may be disposed between the first adhesive portion 310 and the second adhesive portion 320. The third adhesive portion 330 may include a first adhesive layer 331 and a second adhesive layer 332.

The first adhesive layer 331 may entirely overlap the folding area FA. In one embodiment, the first adhesive layer 331 may entirely overlap the folding area FA and may also overlap a part of the first area A1 adjacent to the folding area FA and a part of the second area A2 adjacent to the folding area FA (e.g., the first adhesive layer 331 may be slightly longer than the folding area FA and may extend into the first and second areas A1 and A2).

The second adhesive layer 332 may be disposed under the first adhesive layer 331. The second adhesive layer 332 may overlap a part of the folding area FA.

The second support portion 400 may include a first sub-support portion 410 and a second sub-support portion 420. The second support portion 400 may include a material having relatively high rigidity. For example, the second support portion 400 may include a metal material.

The first sub-support portion 410 may be bonded under the first support portion 200 by the first adhesive portion 310. The first sub-support portion 410 may have a substantially flat surface and may entirely overlap the first area A1. In addition, as described above, the first sub-support portion 410 may include a material having relatively high rigidity. Accordingly, the first area A1 of the display portion 100 may be supported by the first sub-support portion 410, and when the display module DM is unfolded (see, e.g., FIG. 2) or when the display module DM is folded (see, e.g., FIG. 3), the first area A1 of the display portion 100 is supported by the first sub-support portion 410 to have a substantially flat surface.

In one embodiment, the first sub-support portion 410 may overlap a part of the folding area FA adjacent to the first area A1. Accordingly, when the display module DM is in an unfolded state (see, e.g., FIG. 2), the part of the folding area FA adjacent to the first area A1 of the display portion 100 may be supported by the first sub-support portion 410. For example, when the display module DM is in an unfolded state (see, e.g., FIG. 2), the part of the folding area FA of the display portion 100 adjacent to the first area A1 of the display portion 100 may have a substantially flat surface due to the first sub-support portion 410.

The second sub-support portion 420 may be bonded under the first support portion 200 by the second adhesive portion 320. The second sub-support portion 420 may have a substantially flat surface and may entirely overlap the second area A2. In addition, as described above, the second sub-support portion 420 may include a material having relatively high rigidity. Accordingly, the second area A2 of the display portion 100 may be supported by the second sub-support portion 420, and when the display module DM is unfolded (see, e.g., FIG. 2) or when the display module DM is folded (see, e.g., FIG. 3), the second area A2 of the display portion 100 is supported by the second sub-support portion 420 to have a substantially flat surface.

In one embodiment, the second sub-support portion 420 may also overlap a part of the folding area FA adjacent to the second area A2. Accordingly, when the display module DM is in an unfolded state (see, e.g., FIG. 2), the part of the folding area FA adjacent to the second area A2 of the display portion 100 may be supported by the second sub-support portion 420. In other words, when the display module DM is in an unfolded state (see, e.g., FIG. 2), the part of the folding area FA of the display portion 100 adjacent to the second area A2 of the display portion 100 may have a substantially flat surface due to the second sub-support portion 420.

The first sub-support portion 410 and the second sub-support portion 420 may be spaced apart from each other. For example, as illustrated in FIG. 2, when the display module DM is in an unfolded state, the second sub-support portion 420 may be spaced apart from the first sub-support portion 410 in a second direction DR2 perpendicular to each of the first direction DR1 and the folding direction DRF. In such an embodiment, when the display module DM is in an unfolded state, a spacing space between the first sub-support portion 410 and the second sub-support portion 420 may be referred to as a gap GP.

The gap GP may overlap at least a part of the folding area FA. In such an embodiment, when the display module DM is in an unfolded state (see, e.g., FIG. 2), an area overlapping the gap GP in the folding area FA of the display portion 100 may not be supported by the second support portion 400. Accordingly, the area overlapping the gap GP in the folding area FA of the display portion 100 may be vulnerable to an external impact. For example, a user of the display device 1000 who uses the display device 1000 may apply a pressure, such as a touch input, to the area overlapping the gap GP in the folding area FA of the display portion 100 when the display module DM is unfolded. In this case, damage (e.g., pressing, etc.) due to the pressure may occur in the area.

To prevent such damage, the elastic portion 500 including an elastic material (e.g., rubber, PET, etc.) may be attached to the first support portion 200 by the third adhesive portion 330. For example, in one embodiment, the elastic portion 500 may be bonded to the first adhesive layer 331 by the second adhesive layer 332. The elastic portion 500 may be disposed between the first sub-support portion 410 and the second sub-support portion 420. In such an embodiment, when the display module DM is in an unfolded state (see, e.g., FIG. 2), the elastic portion 500 may be pressed in a direction opposite to the second direction DR2 by the first sub-support portion 410 and may be pressed in the second direction DR2 by the second sub-support portion 420.

As described above, when the elastic portion 500 is pressed by the first sub-support portion 410 and the second sub-support portion 420, the elastic portion 500 may be compressed, and the elastic portion 500 may become more rigid. Accordingly, when the display module DM is in an unfolded state, the elastic portion 500 may support the area overlapping the gap GP in the folding area FA of the display portion 100, and damage to the folding area FA may be prevented or mitigated by the elastic portion 500.

When the display module DM is in a folded state (see, e.g., FIG. 3), each of the first sub-support portion 410 and the second sub-support portion 420 may be spaced apart from the elastic portion 500. For example, when the display module DM is in a folded state, the elastic portion 500 may not be pressed by the first sub-support portion 410 and the second sub-support portion 420.

As described above, when the elastic portion 500 is not pressed by the first sub-support portion 410 and the second sub-support portion 420, the elastic portion 500 may be relatively flexible. Accordingly, when the display module DM is in a folded state, the elastic portion 500 may be bent to have a curvature (e.g., a predetermined curvature) in a part of the folding area FA.

As described above, a density of the elastic portion 500 when it is pressed by each of the first sub-support portion 410 and the second sub-support portion 420 when the display module DM is in an unfolded state may be greater than a density of the elastic portion 500 when the display module DM is in a folded state. Accordingly, when the display module DM is in an unfolded state, the elastic portion 500 may be relatively rigid so that the elastic portion 500 may effectively support the display portion 100, and when the display module DM is in a folded state, the elastic portion 500 may be relatively flexible.

In one embodiment, a volume of the elastic portion 500 when the display module DM is in an unfolded state may be about equal to or less than 80% of a volume of the elastic portion 500 when the display module DM is in a folded state to effectively support the display portion 100 when the display module DM is in an unfolded state.

FIGS. 4 to 7 are enlarged cross-sectional views of the area A in FIG. 2 according to various embodiments. FIGS. 4 to 7 are cross-sectional views describing the second support portion 400 according to various embodiments.

Figure 4:
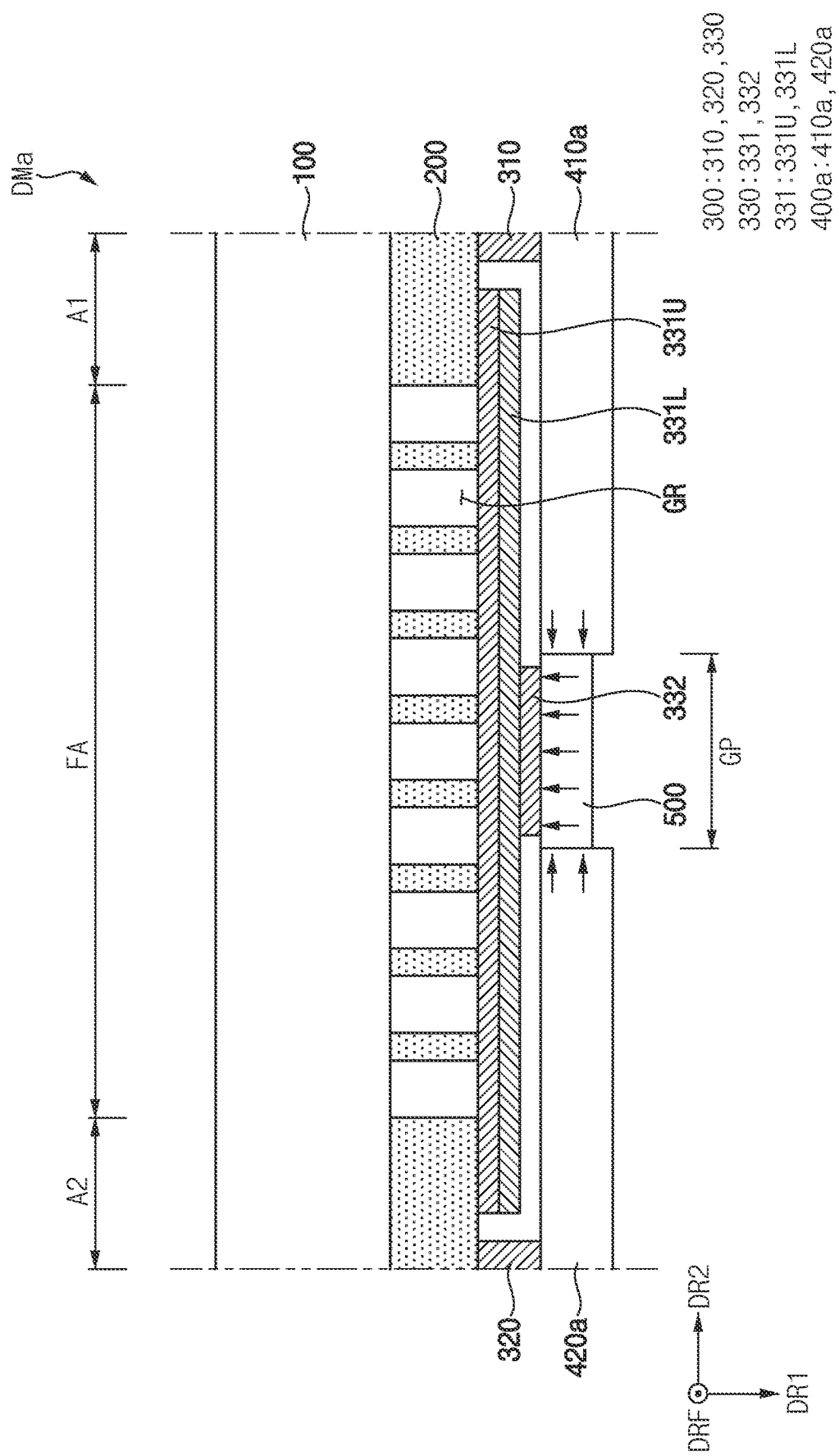
FIGS. 4 to 7 are enlarged cross-sectional views of the area A in FIG. 2 according to various embodiments.

Referring to FIGS. 1 to 4, in one embodiment, the first support portion 200 may have the plurality of grooves GR therein at an area overlapping the folding area FA, and the grooves GR may be formed in (e.g., may have a depth in) the first direction DR1 to improve the flexibility of the first support portion 200 overlapping the folding area FA. Although FIG. 4 illustrates an embodiment in which each of the plurality of grooves GR is formed through (or entirely through) the first support portion 200, a shape of the plurality of grooves GR is not limited thereto. For example, each of the plurality of grooves GR may not be completely formed through (e.g., may have a depth less than that of) the first support portion 200 and may be formed through only a part of (e.g., may extend only partially into) the first support portion 200.

In one embodiment, the first adhesive layer 331 may cover the plurality of grooves GR defined by the first support portion 200. Accordingly, the first adhesive layer 331 may protect the display portion 100 so that foreign substances are not introduced into the display portion 100 through the plurality of grooves GR.

In one embodiment, the first adhesive layer 331 may include an adhesive member 331U and a barrier layer 331L.

The adhesive member 331U may cover the plurality of grooves GR defined in the first support portion 200 and may include an adhesive material. In such an embodiment, the adhesive member 331U including the adhesive material may be relatively vulnerable to the introduction of foreign substances. In other words, the foreign substances may be introduced into the display portion 100 through the plurality of grooves GR by passing through the adhesive member 331U.

To prevent the introduction of such foreign substances, the barrier layer 331L may be bonded under the adhesive member 331U. In such an embodiment, the barrier layer 331L may entirely cover a lower surface of the adhesive member 331U, and accordingly, the barrier layer 331L may prevent or substantially prevent the introduction of foreign substances. The barrier layer 331L may include a flexible inorganic insulating material.

As illustrated in FIG. 4, a second support portion 400*a* may include a first sub-support portion 410*a* and a second sub-support portion 420*a*, and each of the first sub-support portion 410*a* and the second sub-support portion 420*a* may have a rectangular shape when viewed in a cross-sectional view. Accordingly, the first sub-support portion 410*a* may press the elastic portion 500 in the direction opposite to the second direction DR2, and the second sub-support portion 420*a* may press the elastic portion 500 in the second direction DR2.

When the display module DM is in an unfolded state, a width of the elastic portion 500 in the second direction DR2 may decrease and a thickness of the elastic portion 500 in the first direction DR1 may increase in proportion to the decrease in the width of the elastic portion 500 in the second direction DR2. Accordingly, the elastic portion 500 may press (e.g., may support) the lower surface of the display portion 100 overlapping the elastic portion 500 in a direction opposite to the first direction DR1.

Figure 5:
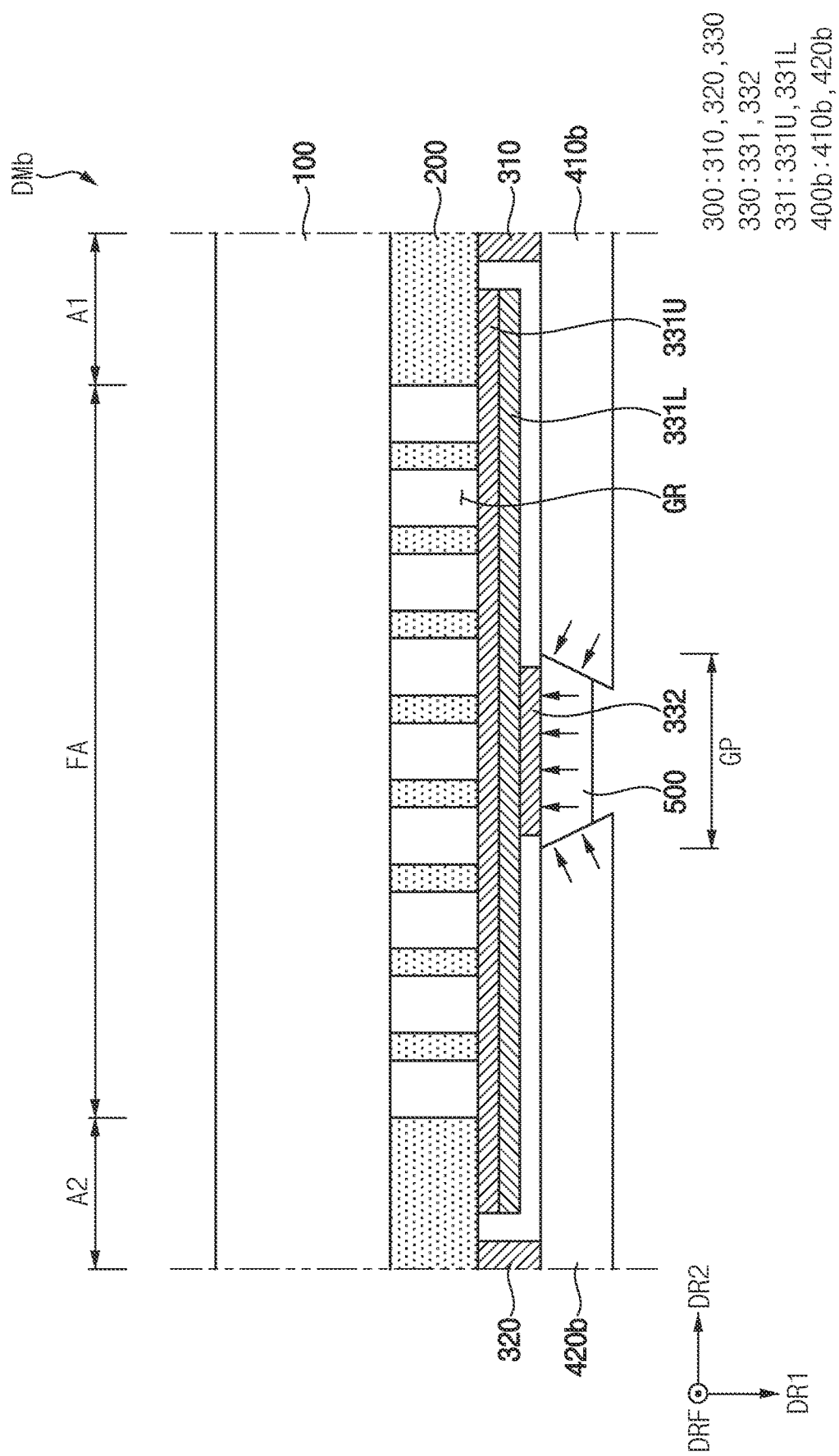

Referring to FIG. 5, different from the second support portion 400*a* described with reference to FIG. 4, each of a first sub-support portion 410*b* and a second sub-support portion 420*b* included in a second support portion 400*b* illustrated in FIG. 5 may have a tapered shape (e.g., a tapered end or edge) when viewed in a cross-sectional view. For example, a spacing distance between the first sub-support portion 410*b* and the second sub-support portion 420*b* may gradually decrease in the first direction DR1.

When the first sub-support portion 410*b* has a tapered shape when viewed in a cross-sectional view, the first sub-support portion 410*b* may press the elastic portion 500 in the direction opposite to the second direction DR2 and may also press the elastic portion 500 in the direction opposite to the first direction DR1. Similarly, the second sub-support portion 420*b* may press the elastic portion 500 in the second direction DR2 and may also press the elastic portion 500 in the direction opposite to the first direction DR1.

Accordingly, compared to the elastic portion 500 pressed by the second support portion 400a described with reference to FIG. 4, the elastic portion 500 pressed by the second support portion 400b shown in FIG. 5 may more effectively support the display portion 100.

Figure 6:
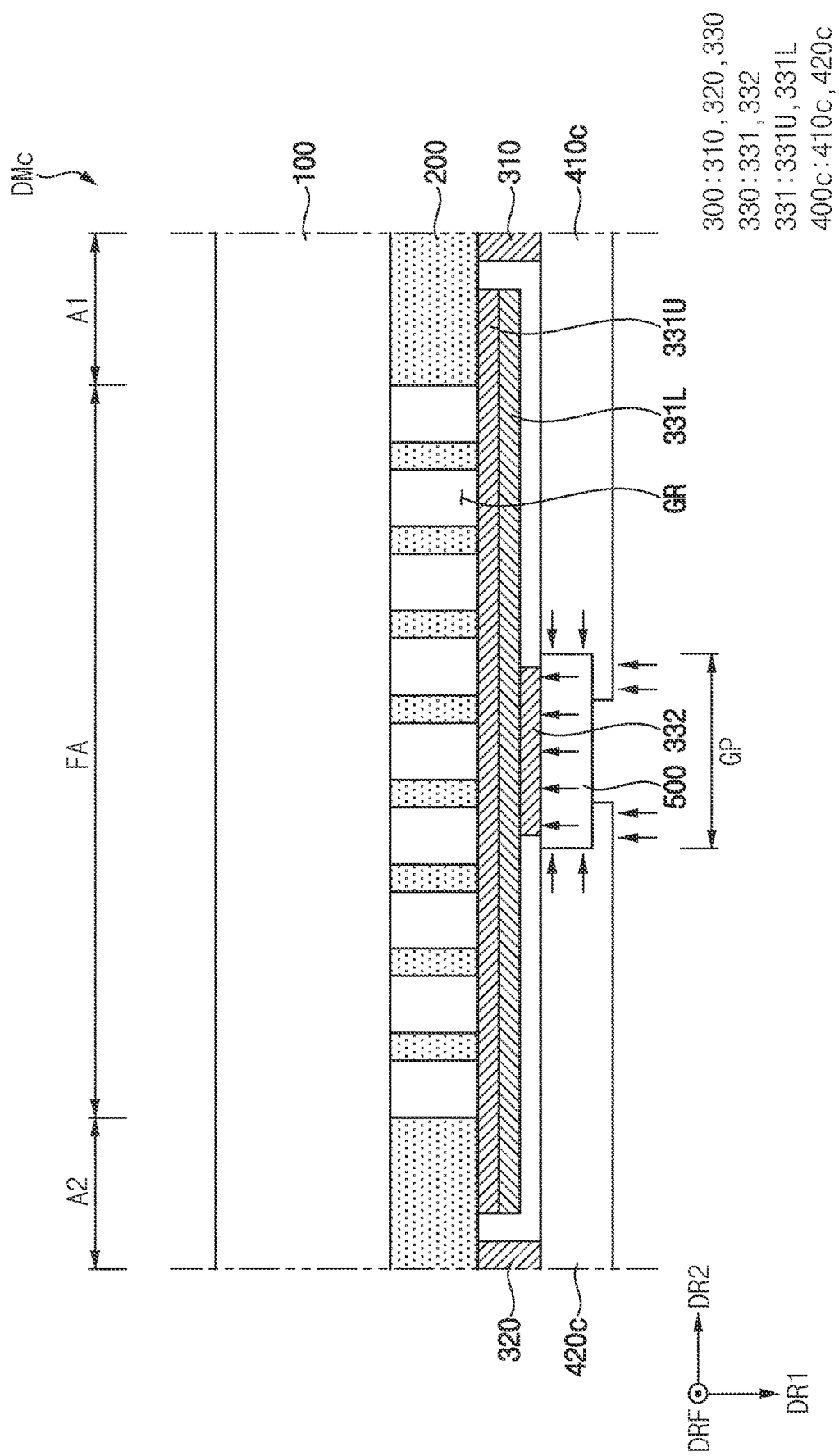

Referring to FIG. 6, different from the second support portion 400a described with reference to FIG. 4, each of a first sub-support portion 410c and a second sub-support portion 420c included in a second support portion 400c illustrated in FIG. 6 may further include a protruding portion (e.g., a protrusion). For example, the first sub-support portion 410c may further include a first protruding portion protruding toward the second sub-support portion 420c (e.g., in the direction opposite to the second direction DR2), and the second sub-support portion 420c may further include a second protruding portion protruding toward the first sub-support portion 410c (e.g., in the second direction DR2).

When the first sub-support portion 410c further includes the first protruding portion, the elastic portion 500 may be further pressed in the direction opposite to the first direction DR1 by the first protruding portion. Likewise, when the second sub-support portion 420c further includes the second protruding portion, the elastic portion 500 may be further pressed in the direction opposite to the first direction DR1 by the second protruding portion.

Accordingly, compared to the elastic portion 500 pressed by the second support portion 400a described with reference to FIG. 4, the elastic portion 500 pressed by the second support portion 400c shown in FIG. 6 may more effectively support the display portion 100.

Figure 7:
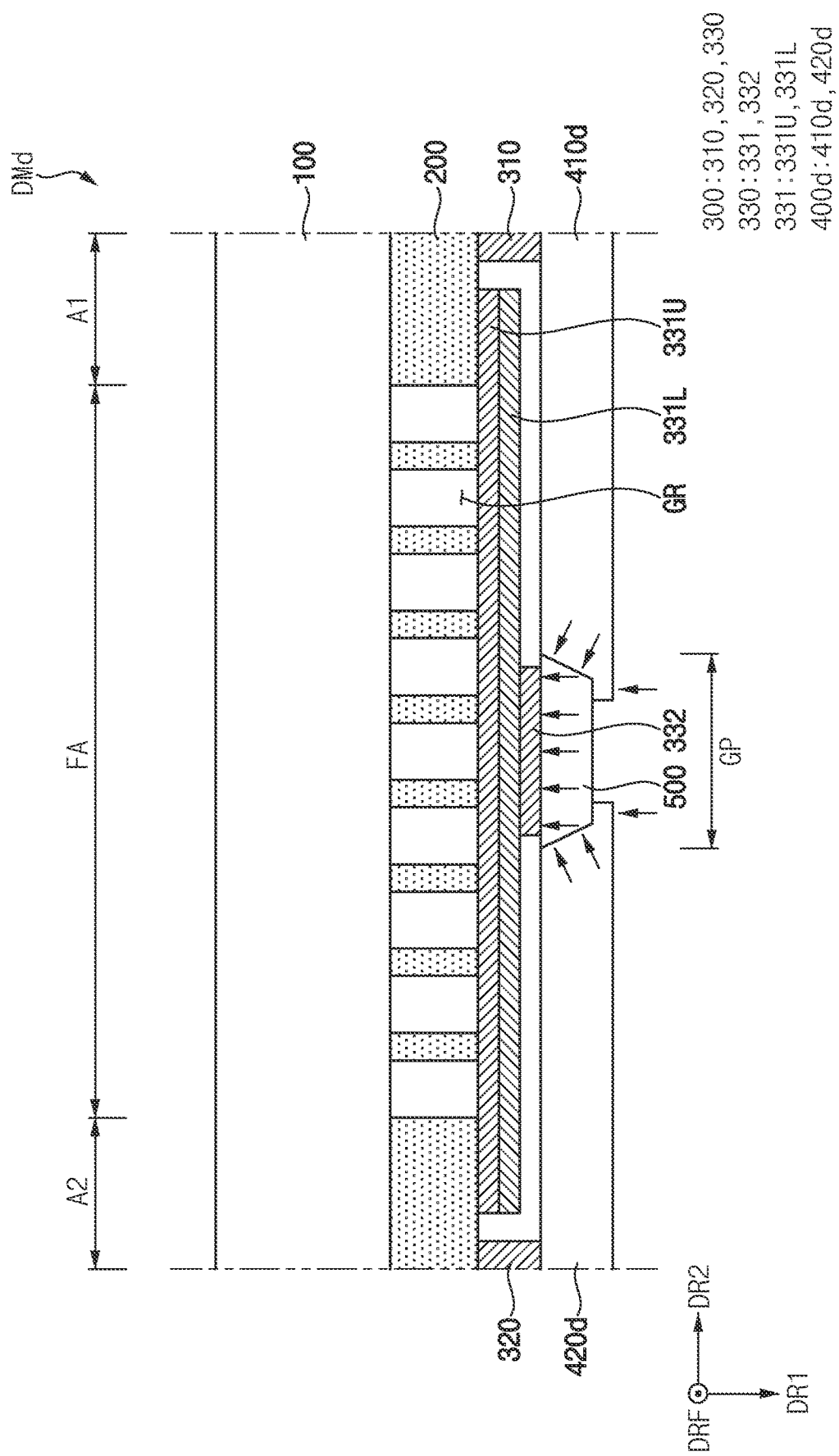

Referring to FIG. 7, different from the second support portion 400a described with reference to FIG. 4, each of a first sub-support portion 410d and a second sub-support portion 420d included in a second support portion 400d illustrated in FIG. 7 may have a tapered shape when viewed in a cross-sectional view and may further include a protruding portion.

For example, a spacing distance between an upper portion of the first sub-support portion 410d and an upper portion of the second sub-support portion 420d may gradually decrease in the first direction DR1, a first protruding portion protruding toward the second sub-support portion 420d may be formed at a lower portion of the first sub-support portion 410d located under the upper portion of the first sub-support portion 410d, and a second protruding portion protruding toward the first sub-support portion 410d may be formed at a lower portion of the second sub-support portion 420d located under the upper portion of the second sub-support portion 420d.

Accordingly, compared to the elastic portion 500 pressed by the second support portion 400a described with reference to FIG. 4, the elastic portion 500 pressed by the second support portion 400d shown in FIG. 7 may more effectively support the display portion 100.

Figure 8:
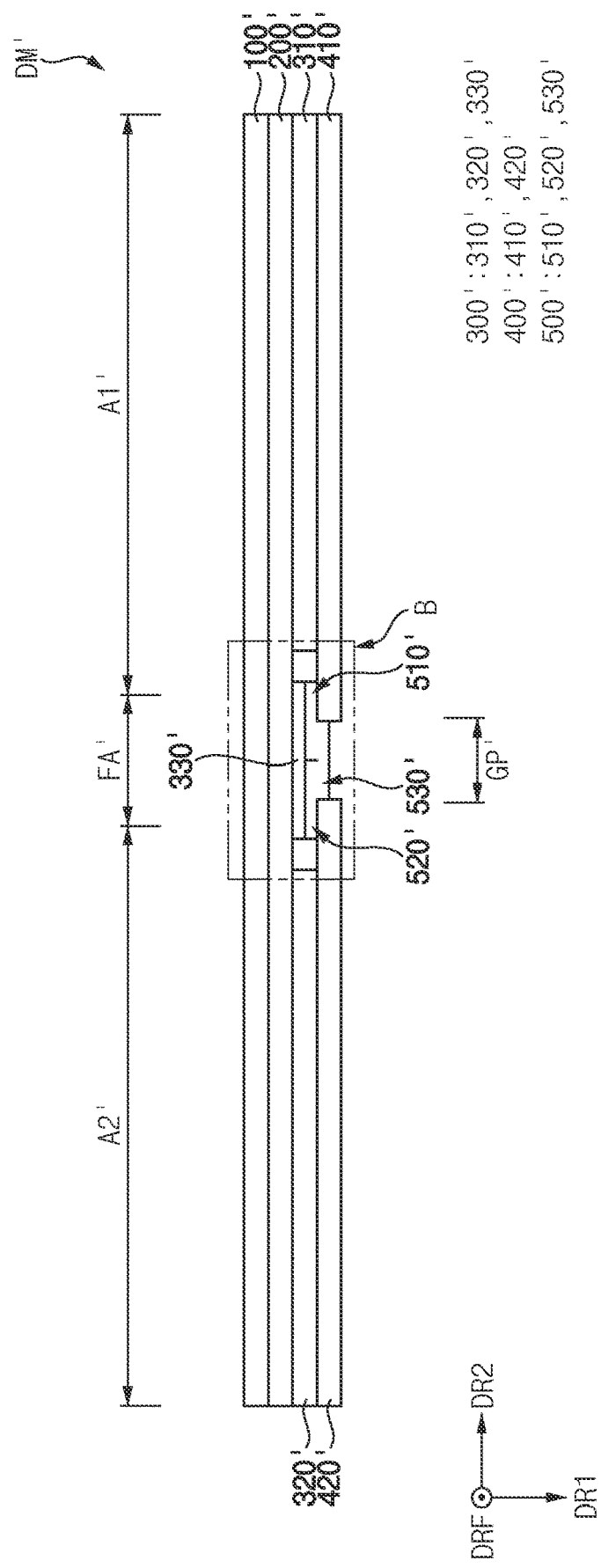
FIGS. 8 and 9 are cross-sectional views of the display module of the display device of FIG. 1 according to another embodiment.
Figure 9:
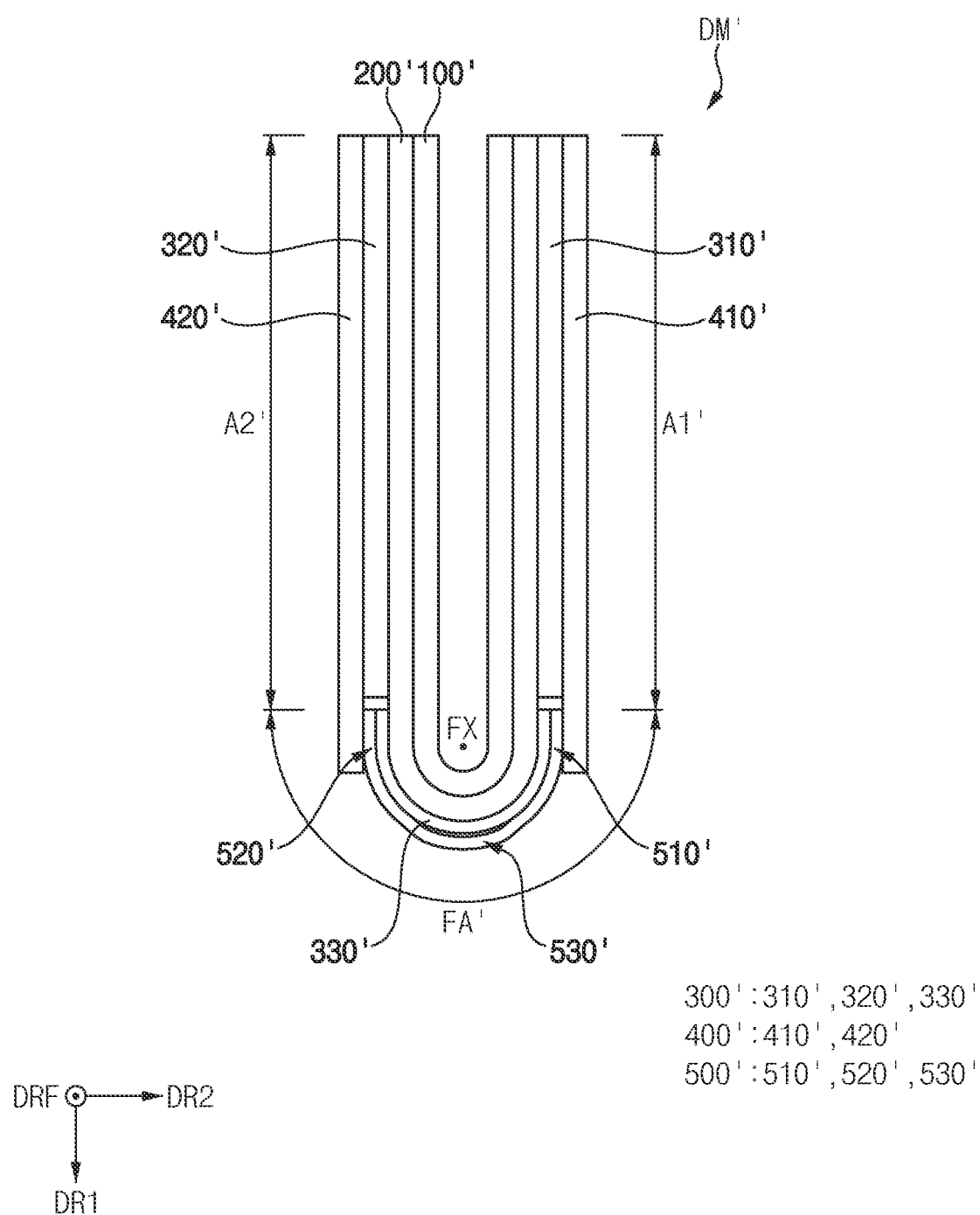

FIGS. 8 and 9 are cross-sectional views of the display module of the display device of FIG. 1 according to another embodiment. FIG. 8 is a cross-sectional view illustrating a state in which the display module is unfolded, and FIG. 9 is a cross-sectional view illustrating a state in which the display module is folded.

Referring to FIGS. 8 and 9, the display device 1000 may include a display module DM'. The display module DM' may be accommodated in a housing including a case for accommodating the display module DM', a hinge member (e.g., a hinge) for guiding repeated folding and unfolding of the display module DM', etc. In such an embodiment, the housing and the display module DM' may constitute the display device 1000 described with reference to FIG. 1.

The display module DM' may include a display portion 100', a first support portion 200', an adhesive portion 300', a second support portion 400', and an elastic portion 500'.

The display portion 100' may be substantially the same as the display portion 100 described with reference to FIGS. 2 and 3. For example, the display portion 100' may include (e.g., may be divided into) a first area A1' corresponding to the first display area DA1 of the display device 1000, a second area A2' corresponding to the second display area DA2 of the display device 1000, and a folding area FA' corresponding to the third display area DA3 of the display device 1000, and may be repeatedly folded or unfolded at the folding area FA' about on a virtual folding axis FX' extending in the folding direction DRF.

The first support portion 200' may be disposed under the display portion 100'. The first support portion 200' may be substantially the same as the first support portion 200 described with reference to FIGS. 2 and 3. For example, the first support portion 200' may support the display portion 100' in the first area A1', the second area A2', and the folding area FA'. In addition, the first support portion 200' may have a plurality of grooves therein (e.g., GR' in FIG. 10) overlapping the folding area FA' and formed in (e.g., having a depth in) the first direction DR1.

The adhesive portion 300' may be disposed under the first support portion 200'. The adhesive portion 300' may include an adhesive material. For example, the adhesive portion 300' may include an adhesive, such as a pressure sensitive adhesive (PSA). The adhesive portion 300' may adhere components disposed under the first support portion 200' (e.g., the second support portion 400' and the elastic portion 500'), and accordingly, the components disposed under the first support portion 200' may be attached under the first support portion 200'.

The adhesive portion 300' may include a first adhesive portion 310', a second adhesive portion 320', and a third adhesive portion 330'.

The first adhesive portion 310' may be substantially the same as the first adhesive portion 310 described with reference to FIGS. 2 and 3. For example, the first adhesive portion 310' may overlap at least a part of the first area A1'.

The second adhesive portion 320' may be substantially the same as the second adhesive portion 320 described with reference to FIGS. 2 and 3. For example, the second adhesive portion 320' may overlap at least a part of the second area A2', and the second adhesive portion 320' and the first adhesive portion 310' may be spaced apart from each other.

The third adhesive portion 330' may be disposed between the first adhesive portion 310' and the second adhesive portion 320'. In one embodiment, the third adhesive portion 330' may include a plurality of layers. The plurality of layers included in the third adhesive portion 330' will be described in more detail below with reference to FIG. 10.

The second support portion 400' may be substantially the same as the second support portion 400 described with reference to FIGS. 2 and 3. For example, the second support portion 400' may include a first sub-support portion 410' bonded under the first support portion 200' by the first adhesive portion 310' and a second sub-support portion 420' bonded under the first support portion 200' by the second adhesive portion 320'.

Each of the first sub-support portion 410' and the second sub-support portion 420' may have a substantially flat surface. In addition, the first sub-support portion 410' may entirely overlap the first area A1', and the second sub-support portion 420' may entirely overlap the second area A2'. Accordingly, the first area A1' of the display portion 100' may be supported by the first sub-support portion 410', and the second area A2' of the display portion 100' may be supported by the second sub-support portion 420'. That is, when the display module DM' is unfolded (see, e.g., FIG. 8) or when the display module DM' is folded (see, e.g., FIG. 9), the first area A1' of the display portion 100' supported by the first sub-support portion 410' and the second area A2' of the display portion 100' supported by the second sub-support portion 420' may have substantially flat surfaces.

In one embodiment, the first sub-support portion 410' may overlap a part of the folding area FA' adjacent to the first area A1' (e.g., may partially extend into the folding area FA' adjacent to the first area A1'). Accordingly, when the display module DM' is in an unfolded state (see, e.g., FIG. 8), the part of the folding area FA' adjacent to the first area A1' of the display portion 100' may be supported by the first sub-support portion 410'.

In one embodiment, the second sub-support portion 420' may also overlap a part of the folding area FA' adjacent to the second area A2' (e.g., may partially extend into the folding area FA' adjacent to the second area A2'). Accordingly, when the display module DM' is in an unfolded state (see, e.g., FIG. 8), the part of the folding area FA' adjacent to the second area A2' of the display portion 100' may be supported by the second sub-support portion 420'.

The first sub-support portion 410' and the second sub-support portion 420' may be spaced apart from each other. For example, as illustrated in FIG. 8, when the display module DM' is in an unfolded state, the second sub-support portion 420' may be spaced apart from the first sub-support portion 410' in the second direction DR2. In such an embodiment, a spacing space between the first sub-support portion 410' and the second sub-support portion 420' may be referred to as a gap GP' when the display module DM' is in an unfolded state.

The gap GP' may overlap at least a part of the folding area FA'. When the display module DM' is in an unfolded state (see, e.g., FIG. 8), an area overlapping the gap GP' in the folding area FA' of the display portion 100' may not be supported by the second support portion 400'. Accordingly, the area overlapping the gap GP' in the folding area FA' may be vulnerable to an external impact. For example, the user of the display device 1000 who uses the display device 1000 may apply a pressure, such as a touch input, to the area overlapping the gap GP' in the folding area FA' of the display portion 100' when the display module DM' is unfolded. In this case, damage (e.g., a pressing, etc.) due to the pressure may occur in the area.

The elastic portion 500' including an elastic material (e.g., rubber, PET, etc.) may be attached to the first support portion 200' by the third adhesive portion 330' to prevent or mitigate such damage. For example, the elastic portion 500' may include a first fixing portion 510' bonded to the first support portion 200' by the third adhesive portion 330' between the first sub-support portion 410' and the first support portion 200', and a second fixing portion 520' bonded to the first support portion 200' by the third adhesive portion 330' between the second sub-support portion 420' and the first support portion 200' and spaced apart from the first fixing portion 510'.

In addition, as illustrated in FIG. 8, when the display module DM' is in an unfolded state, the elastic portion 500' may be pressed by the first sub-support portion 410' and the second sub-support portion 420'. For example, the elastic portion 500' may include a non-fixing portion 530' that connects (e.g., that extends between) the first fixing portion 510' and the second fixing portion 520' between the first fixing portion 510' and the second fixing portion 520'. In such an embodiment, the non-fixing portion 530' may be defined as a part of the elastic portion 500' that is not bonded to the third adhesive portion 330' between the first fixing portion 510' and the second fixing portion 520'. Accordingly, when the display module DM' is in an unfolded state, the non-fixing portion 530' may be pressed in the direction opposite to the second direction DR2 by the first sub-support portion 410' and may be pressed in the second direction DR2 by the second sub-support portion 420'.

As described above, when the non-fixing portion 530' is pressed by the first sub-support portion 410' and the second sub-support portion 420', the non-fixing portion 530' may be compressed, and the non-fixing portion 530' may be more rigid. Accordingly, the non-fixing portion 530' may support the area overlapping the gap GP' in the folding area FA' of the display portion 100' when the display module DM' is in an unfolded state.

When the display module DM' is in a folded state (see, e.g., FIG. 9), each of the first sub-support portion 410' and the second sub-support portion 420' may be spaced apart from the non-fixing portion 530'. In other words, when the display module DM' is in a folded state, the non-fixing portion 530' may not be pressed by the first sub-support portion 410' and the second sub-support portion 420'.

As described above, when the non-fixing portion 530' is not pressed by the first sub-support portion 410' and the second sub-support portion 420', the non-fixing portion 530' may be relatively flexible. In this case, when the display module DM' is in a folded state (see, e.g., FIG. 9), a part of the non-fixing portion 530' may be spaced apart from the third adhesive portion 330' and may have a curved shape.

As described above, a density of the non-fixing portion 530' may be greater than the density of the non-fixing portion 530' when the display module DM' is in an unfolded state and the non-fixing portion 530' is pressed by each of the first sub-support portion 410' and the second sub-support portion 420' compared to when the display module DM' is in a folded state. Accordingly, when the display module DM' is in an unfolded state, the non-fixing portion 530' may be relatively rigid to effectively support the display portion 100' and when the display module DM' is in a folded state, the non-fixing portion 530' may be relatively flexible.

In one embodiment, a volume of the non-fixing portion 530' when the display module DM' is in an unfolded state may be about equal to or less than 80% of a volume of the non-fixing portion 530' when the display module DM' is in a folded state to effectively support the display portion 100' when the display module DM' is in an unfolded state.

In one embodiment, as illustrated in FIGS. 8 and 9, when the display module DM' is folded or unfolded, the first fixing portion 510' may make direct contact with an upper surface of the first sub-support portion 410' and the second fixing portion 520' may make direct contact with an upper surface of the second sub-support portion 420'.

FIGS. 10 to 13 are enlarged cross-sectional views of the area B in FIG. 8 according to various embodiments. FIGS. 10 to 13 are cross-sectional views describing the second support portion 400' according to various embodiments.

Referring to FIGS. 1, 8, 9, and 10, in one embodiment, the first support portion 200' may have the plurality of grooves GR' defined therein overlapping the folding area FA' and formed in the first direction DR1 to improve the flexibility of the first support portion 200' overlapping the folding area FA'. Although FIG. 10 illustrates an embodiment in which each of the plurality of grooves GR' is formed through (e.g., entirely through) the first support portion 200', a shape (e.g., a depth) of the plurality of grooves GR' is not limited thereto. For example, each of the plurality of grooves GR' may not be completely formed through the first support portion 200' and may be formed through only a part of (e.g., may extend only partially through) the first support portion 200'.

In one embodiment, the third adhesive portion 330' may include a first adhesive layer 331', a barrier layer 332', a first sub-adhesive layer 333', and a second sub-adhesive layer 334'.

The first adhesive layer 331' may cover the plurality of grooves GR' defined in the first support portion 200' and may include an adhesive material. In such an embodiment, the first adhesive layer 331' including the adhesive material may be relatively vulnerable to the introduction of foreign substances. In other words, foreign substances may be introduced into the display portion 100' through the plurality of grooves GR' by passing through the first adhesive layer 331'.

To prevent such introduction of foreign substances, the barrier layer 332' may be bonded under the first adhesive layer 331' and may entirely cover the lower surface of the first adhesive layer 331'. Accordingly, the barrier layer 332' may prevent the introduction of foreign substances. The barrier layer 332' may include a flexible inorganic insulating material.

The first sub-adhesive layer 333' may be bonded under the barrier layer 332'. The first sub-adhesive layer 333' may bond the first fixing portion 510' and the barrier layer 332'. In such an embodiment, the first sub-adhesive layer 333' may be disposed between a first sub-support portion 410a and the display portion 100' when a display module DMa' is in an unfolded state as illustrated in FIG. 10.

The second sub-adhesive layer 334' may be bonded under the barrier layer 332' and may be spaced apart from the first sub-adhesive layer 333'. The second sub-adhesive layer 334' may bond the second fixing portion 520' to the barrier layer 332'. In such an embodiment, the second sub-adhesive layer 334' may be disposed between a second sub-support portion 420a and the display portion 100' when the display module DMa' is in an unfolded state as illustrated in FIG. 10.

As illustrated in FIG. 10, the second support portion 400a may include the first sub-support portion 410a and the second sub-support portion 420a, and each of the first sub-support portion 410a and the second sub-support portion 420a may have a rectangular shape when viewed in a cross-sectional view. Accordingly, the first sub-support portion 410a may press the non-fixing portion 530' in the direction opposite to the second direction DR2, and the second sub-support portion 420a may press the non-fixing portion 530' in the second direction DR2. Accordingly, the non-fixing portion 530' may be compressed by the first sub-support portion 410a and the second sub-support portion 420a and may press (e.g., may support) the lower surface of the display portion 100' in the direction opposite to the first direction DR1 by pressing the lower surface of the barrier layer 332' between the first sub-adhesive layer 333' and the second sub-adhesive layer 334'.

Referring to FIG. 11, different from the second support portion 400a described with reference to FIG. 10, each of a first sub-support portion 410b' and a second sub-support portion 420b' included in a second support portion 400b' illustrated in FIG. 10 may have a tapered shape when viewed in a cross-sectional view. For example, a spacing distance between the first sub-support portion 410b' and the second sub-support portion 420b' may gradually decrease in the first direction DR1.

When the first sub-support portion 410b' has a tapered shape when viewed in a cross-sectional view, the first sub-support portion 410b' may press the non-fixing portion 530' in the direction opposite to the second direction DR2 and may also press the non-fixing portion 530' in the direction opposite to the first direction DR1. Similarly, the second sub-support portion 420b' may press the non-fixing portion 530' in the second direction DR2 and may also press the non-fixing portion 530' in the direction opposite to the first direction DR1.

Accordingly, compared to the non-fixing portion 530' pressed by the second support portion 400a described with reference to FIG. 10, the non-fixing portion 530' pressed by the second support portion 400b' shown in FIG. 11 may more effectively support the display portion 100'.

Referring to FIG. 12, different from the second support portion 400a described with reference to FIG. 10, each of a first sub-support portion 410c and a second sub-support portion 420c included in a second support portion 400c illustrated in FIG. 12 may further include a protruding portion (e.g., a protrusion). For example, the first sub-support portion 410c may further include a first protruding portion protruding toward the second sub-support portion 420c (e.g., in the direction opposite to the second direction DR2), and the second sub-support portion 420c may further include a second protruding portion protruding toward the first sub-support portion 410c (e.g., in the second direction DR2).

When the first sub-support portion 410c further includes the first protruding portion, the non-fixing portion 530' may be further pressed in the direction opposite to the first direction DR1 by the first protruding portion. Likewise, when the second sub-support portion 420c' further includes the second protruding portion, the non-fixing portion 530' may be further pressed in the direction opposite to the first direction DR1 by the second protruding portion.

Accordingly, compared to the non-fixing portion 530' pressed by the second support portion 400a described with reference to FIG. 10, the non-fixing portion 530' pressed by the second support portion 400c shown in FIG. 12 may more effectively support the display portion 100'.

Referring to FIG. 13, different from the second support portion 400a described with reference to FIG. 10, each of a first sub-support portion 410d' and a second sub-support portion 420d' included in a second support portion 400d' illustrated in FIG. 13 may have a tapered shape (e.g., a tapered end or edge) when viewed in a cross-sectional view and may further include a protruding portion.

For example, a spacing distance between an upper portion of the first sub-support portion 410d' and an upper portion of the second sub-support portion 420d' may gradually decrease in the first direction DR1, a first protruding portion protruding toward the second sub-support portion 420d' may be formed at a lower portion of the first sub-support portion 410d' located under the upper portion of the first sub-support portion 410d', and a second protruding portion protruding toward the first sub-support portion 410d' may be formed at a lower portion of the second sub-support portion 420d' located under the upper portion of the second sub-support portion 420d'.

Accordingly, compared to the non-fixing portion 530' pressed by the second support portion 400a described with reference to FIG. 10, the non-fixing portion 530' pressed by the second support portion 400d' shown in FIG. 13 may more effectively support the display portion 100'.

Further, the present disclosure may be applied to a display module and an electronic device including the same. For example, the present disclosure may be applied to a smartphone, a smart pad, a smart watch, a tablet PC, a vehicle navigation system, a television, a computer monitor, etc.

While the present disclosure has been described with reference to some embodiments, it will be understood by those skilled in the art that the present disclosure can be modified and changed in various forms without departing from the concept and scope of the present disclosure described in the appended claims and their equivalents.

What is claimed is:

1. A display module comprising:
a display portion having a first area, a second area spaced apart from the first area, and a folding area between the first area and the second area;
a first support portion under the display portion and supporting the display portion in the first area, the second area, and the folding area;
a second support portion under the first support portion, the second support portion comprising a first sub-support portion supporting the first area of the display portion and a second sub-support portion supporting the second area of the display portion and spaced apart from the first sub-support portion; and
an elastic portion between the first sub-support portion and the second sub-support portion,
wherein the elastic portion is compressed by each of the first sub-support portion and the second sub-support portion when the display portion is unfolded to support the folding area of the display portion;
a first adhesive portion between the first sub-support portion and the first support portion and bonding the first sub-support portion and the first support portion to each other;
a second adhesive portion between the second sub-support portion and the first support portion and bonding the second sub-support portion and the first support portion to each other; and
a third adhesive portion between the first adhesive portion and the second adhesive portion and bonding the first support portion and the elastic portion to each other;
wherein the third adhesive portion comprises:
a first adhesive layer under the first support portion, the first adhesive layer comprising an adhesive member entirely overlapping the folding area and a barrier layer under the adhesive member and entirely overlapping the folding area; and
a second adhesive layer under the barrier layer and bonding the barrier layer and the elastic portion to each other.

2. The display module of claim 1, wherein each of the first sub-support portion and the second sub-support portion is spaced apart from the elastic portion when the display portion is folded.

3. The display module of claim 1, wherein the first support portion has a plurality of grooves therein, the grooves at an area of the first support portion overlapping the folding area and extending in a thickness direction of the display portion.

4. The display module of claim 1, wherein the first sub-support portion comprises a first protruding portion protruding toward the second sub-support portion when the display portion is unfolded to press a lower surface of the elastic portion, and
wherein the second sub-support portion comprises a second protruding portion protruding toward the first sub-support portion when the display portion is unfolded to press the lower surface of the elastic portion.

5. The display module of claim 1, wherein, when the display portion is unfolded, a spacing distance between the first sub-support portion and the second sub-support portion gradually decreases in a direction away from a lower surface of the display portion when viewed in a cross-sectional view.

6. The display module of claim 1, wherein the first sub-support portion entirely overlaps the first area of the display portion when the display portion is unfolded, and
wherein the second sub-support portion entirely overlaps the second area of the display portion when the display portion is unfolded.

7. The display module of claim 1, wherein a density of the elastic portion when the display portion is unfolded is greater than the density of the elastic portion when the display portion is folded.

8. The display module of claim 1, wherein a volume of the elastic portion when the display portion is unfolded is equal to or less than 80% of the volume of the elastic portion in when the display portion is folded.

9. A display module comprising:
a display portion having a first area, a second area spaced apart from the first area, and a folding area between the first area and the second area;
a first support portion under the display portion and supporting the display portion in the first area, the second area, and the folding area;
a second support portion under the first support portion, the second support portion comprising a first sub-support portion supporting the first area of the display portion and a second sub-support portion supporting the second area of the display portion and spaced apart from the first sub-support portion; and
an elastic portion comprising:
a first fixing portion bonded to the first support portion between the first sub-support portion and the first support portion;
a second fixing portion bonded to the first support portion between the second sub-support portion and the first support portion; and
a non-fixing portion extending between the first fixing portion and the second fixing portion and supporting the folding area of the display portion when the non-fixing portion is compressed by each of the first sub-support portion and the second sub-support portion when the display portion is unfolded;
a first adhesive layer under the first support portion and entirely overlapping the folding area;
a barrier layer under the first adhesive layer and entirely overlapping the folding area; and
a second adhesive layer under the barrier layer and comprising:
a first sub-adhesive layer bonding the barrier layer and the first fixing portion to each other; and
a second sub-adhesive layer bonding the barrier layer and the second fixing portion to each other and spaced apart from the first sub-adhesive layer.

10. The display module of claim 9, wherein the first support portion has a plurality of grooves therein at an area overlapping the folding area and extending in a thickness direction of the display portion.

11. The display module of claim 9, wherein the first sub-support portion comprises a first protruding portion protruding toward the second sub-support portion when the display portion is unfolded to press a lower surface of the elastic portion, and wherein the second sub-support portion comprises a second protruding portion protruding toward the first sub-support portion when the display portion is unfolded to press the lower surface of the elastic portion.

12. The display module of claim 9, wherein, when the display portion is unfolded, a spacing distance between the first sub-support portion and the second sub-support portion gradually decreases in a direction away from a lower surface of the display portion when viewed in a cross-sectional view.

13. The display module of claim 9, wherein the first sub-support portion entirely overlaps the first area of the display portion when the display portion is unfolded, and wherein the second sub-support portion entirely overlaps the second area of the display portion when the display portion is unfolded.

14. The display module of claim 9, wherein a density of the non-fixing portion when the display portion is unfolded is greater than the density of the non-fixing portion when the display portion is folded.

15. The display module of claim 9, wherein a volume of the non-fixing portion when the display portion is unfolded is equal to or less than 80% of the volume of the non-fixing portion when the display portion is folded.

16. The display module of claim 9, wherein the first fixing portion directly contacts an upper surface of the first sub-support portion, and wherein the second fixing portion directly contacts an upper surface of the second sub-support portion.

17. The display module of claim 9, wherein each of the first sub-support portion and the second sub-support portion is spaced apart from the non-fixing portion when the display portion is folded.

* * * * *